(12) United States Patent
Liu et al.

(10) Patent No.: US 11,640,095 B2
(45) Date of Patent: May 2, 2023

(54) DISPLAY COVER PLATE, METHOD FOR MANUFACTURING THE SAME AND DISPLAY DEVICE

(71) Applicant: BOE TECHNOLOGY GROUP CO., LTD., Beijing (CN)

(72) Inventors: Fengjuan Liu, Beijing (CN); Hongda Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 178 days.

(21) Appl. No.: 16/908,547

(22) Filed: Jun. 22, 2020

(65) Prior Publication Data

US 2021/0191213 A1 Jun. 24, 2021

(30) Foreign Application Priority Data

Dec. 18, 2019 (CN) .......................... 201911310414.3

(51) Int. Cl.
*G02F 1/15* (2019.01)
*G02F 1/155* (2006.01)
(Continued)

(52) U.S. Cl.
CPC .............. *G02F 1/155* (2013.01); *G02F 1/163* (2013.01); *G02F 1/15* (2013.01);
(Continued)

(58) Field of Classification Search
CPC . G02F 1/155; G02F 1/163; G02F 1/15; G02F 2001/1635; G02F 2203/10;
(Continued)

(56) References Cited

U.S. PATENT DOCUMENTS 9,599,851 B2 3/2017 Zhang et al.
10,372,012 B2 8/2019 Wang et al.
(Continued)

FOREIGN PATENT DOCUMENTS

CN 103941468 A 7/2014
CN 105353432 A 2/2016
(Continued)

OTHER PUBLICATIONS

Office Action issued in corresponding Chinese Patent Application No. 201911310414.3 dated Nov. 19, 2021.
(Continued)

*Primary Examiner* — Mahidere S Sahle
(74) *Attorney, Agent, or Firm* — McDermott Will & Emery LLP

(57) ABSTRACT

A display cover plate, a manufacturing method therefor and a display device are provided, The display cover plate includes: a substrate; and an electrochromic unit on the substrate, the electrochromic unit includes: a first electrode on the substrate; an electrochromic layer on a side of the first electrode away from the substrate; and a second electrode on a side of the electrochromic layer away from the substrate, wherein the first electrode and the second electrode are configured to generate an electric field, and the electrochromic layer allows light of different colors to pass through based on a change of the electric field.

12 Claims, 3 Drawing Sheets

(51) Int. Cl.
*G02F 1/163* (2006.01)
*H01L 27/32* (2006.01)

(52) U.S. Cl.
CPC .. *G02F 2001/1635* (2013.01); *G02F 2203/10* (2013.01); *H01L 27/3232* (2013.01)

(58) Field of Classification Search
CPC ............. H01L 27/3232; H01L 27/3244; H01L 27/3251; H01L 2227/323
USPC .......... 349/106–109; 359/245–284; 385/2–3, 385/8–10
See application file for complete search history.

(56) References Cited

U.S. PATENT DOCUMENTS

| | | | | |
|---|---|---|---|---|
| 2009/0323171 | A1* | 12/2009 | Gibson | G02F 1/167 359/296 |
| 2014/0168742 | A1* | 6/2014 | Hashimura | G02F 1/1393 977/773 |
| 2015/0277202 | A1* | 10/2015 | Mattox | G02F 1/1524 359/275 |
| 2015/0286091 | A1* | 10/2015 | Zhang | G02F 1/163 359/275 |
| 2016/0018923 | A1* | 1/2016 | Zhang | G06F 3/0445 345/87 |
| 2017/0139306 | A1* | 5/2017 | Wang | G02F 1/23 |
| 2019/0056612 | A1* | 2/2019 | Li | G02F 1/13318 |

FOREIGN PATENT DOCUMENTS

| | | | | |
|---|---|---|---|---|
| CN | 106024846 | A | | 10/2016 |
| CN | 106384565 | A | * | 2/2017 |
| CN | 106384565 | A | | 2/2017 |
| CN | 107450223 | A | * | 12/2017 ......... G02F 1/13306 |
| CN | 108380249 | A | | 8/2018 |
| KR | 10-2023634 | B1 | | 9/2019 |
| KR | 10-2030010 | B1 | | 10/2019 |

OTHER PUBLICATIONS

Advances in Nanophotonics, pp. 13-16, Shanghai Jiaotong University Press, Oct. 31, 2014.
Second Office Action issued in corresponding CN Patent Application No. 201911310414.3, dated Jul. 1, 2022.

* cited by examiner

DISPLAY COVER PLATE, METHOD FOR MANUFACTURING THE SAME AND DISPLAY DEVICE

CROSS-REFERENCE TO RELATED APPLICATION

This application claims the benefit of Chinese Patent Application No. 201911310414.3 filed on Dec. 18, 2019 in the State Intellectual Property Office of China, the whole disclosure of which is incorporated herein by reference.

TECHNICAL FIELD

The present disclosure relates to the field of display technologies, and in particular, to a display cover plate, a manufacturing method therefor and a display device.

BACKGROUND

The PPI of the display device refers to the number of pixels of the display screen per inch. In current display devices, whether it is an LCD display device based on liquid crystal display or an OLED display device based on organic light emitting diodes, each sub-pixel is usually only responsible for displaying one color. The realization of full-color display relies on the mixing of multiple colors of light emitted by multiple sub-pixels. For example, in a commonly used three-color color scheme, each pixel requires three sub-pixels to display RGB primary colors, respectively. In order to achieve a better display effect, a color scheme involving more colors needs to be adopted, such as four-color RGBW or RGBY. With the development of display technology, users' requirements for display devices are also increasing. Obviously, when the size of the display screen is fixed, the more sub-pixels contained in each pixel, the lower the PPI of the display screen.

SUMMARY

Some embodiments of the present disclosure provide a display cover plate, comprising: a substrate; and an electrochromic unit on the substrate, the electrochromic unit comprising: a first electrode on the substrate; an electrochromic layer on a side of the first electrode away from the substrate; and a second electrode on a side of the electrochromic layer away from the substrate, wherein the first electrode and the second electrode are configured to generate an electric field, and the electrochromic layer allows light of different colors to pass through based on a change of the electric field.

In some embodiments, the change of the electric field comprises a change in a duration of the electric field and a change in an intensity of the electric field.

In some embodiments, both the first electrode and the second electrode are formed of a transparent conductive material.

In some embodiments, the electrochromic layer comprises: metal nanoparticles with localized surface plasmon resonance characteristics; and a colored layer containing a color-changing metal that may undergo oxidation and/or reduction reactions under the action of the electric field.

In some embodiments, the electrochromic layer further comprises: an insulating isolation layer on the side of the first electrode away from the substrate, the insulating isolation layer being provided with a through hole penetrating the insulating isolation layer, wherein the metal nanoparticles are accommodated in the through hole, and the colored layer is located on a side of the insulating isolation layer away from the first electrode, and is filled into the through hole.

In some embodiments, the metal nanoparticles comprise gold nanoparticles, and a material of the colored layer comprises silver ion gel.

In some embodiments, a particle size of the gold nanoparticles is in a range of 0.5 to 5 nm, and a content of silver ions in the silver ion gel is in a range of 0.5 to 50 mg/ml.

In some embodiments, a diameter of the through hole in the insulating isolation layer is in a range of 10 to 100 nm.

In some embodiments, the diameter of the through hole in the insulating isolation layer is in a range of 40 to 60 nm.

In some embodiments, the display cover plate further comprising: a thin film transistor between the substrate and the electrochromic unit, the thin film transistor comprising a source electrode and a drain electrode, wherein the first electrode is electrically connected to the source electrode or the drain electrode of the thin film transistor, the thin film transistor is configured to control the first electrode to receive a first voltage signal.

In some embodiments, the display cover plate further comprising: a planarization layer between the thin film transistor and the first electrode, wherein the first electrode is electrically connected to the source electrode or the drain electrode of the thin film transistor through a via hole penetrating the planarization layer.

In some embodiments, the display cover plate comprises a plurality of electrochromic units arranged in an array, and the plurality of second electrodes of the plurality of electrochromic units constitute a continuous integral structure.

In some embodiments, the plurality of electrochromic layers of the plurality of electrochromic units constitute a continuous integral structure.

Some embodiments of the present disclosure provide a method for manufacturing a display cover plate, comprising: forming a first electrode on a substrate; forming an electrochromic layer on a side of the first electrode away from the substrate; and forming a second electrode on a side of the electrochromic layer, wherein the first electrode and the second electrode are configured to generate an electric field, and the electrochromic layer allows light of different colors to pass through based on a change of the electric field.

In some embodiments, forming the electrochromic layer on the side of the first electrode away from the substrate comprises: forming an insulating isolation layer on the side of the first electrode away from the substrate; forming a through hole penetrating the insulating isolation layer in the insulating isolation layer; forming metal nanoparticles in the through hole; and forming a colored layer on a side of the insulating isolation layer away from the substrate and in the through hole.

In some embodiments, before forming the first electrode on the substrate, the method further comprises: forming a thin film transistor on the substrate, wherein the thin film transistor is located between the substrate and the first electrode.

Some embodiments of the present disclosure provide a display device, comprising: the display cover plate of the above embodiments; and a display substrate attached to the display cover plate, wherein the display substrate comprises a pixel unit, and an orthographic projection of the pixel unit on the substrate at least partially overlaps an orthographic projection of the electrochromic unit on the substrate.

In some embodiments, the display cover plate comprises a plurality of electrochromic units arranged in an array, the display substrate comprises a plurality of pixel units arranged in an array, and the plurality of electrochromic units correspond to the plurality of pixel units in one-to-one correspondence.

In some embodiments, the pixel unit comprises an organic light emitting device, and the display substrate is an OLED display substrate.

DETAILED DESCRIPTION OF EMBODIMENTS

Figure 1:
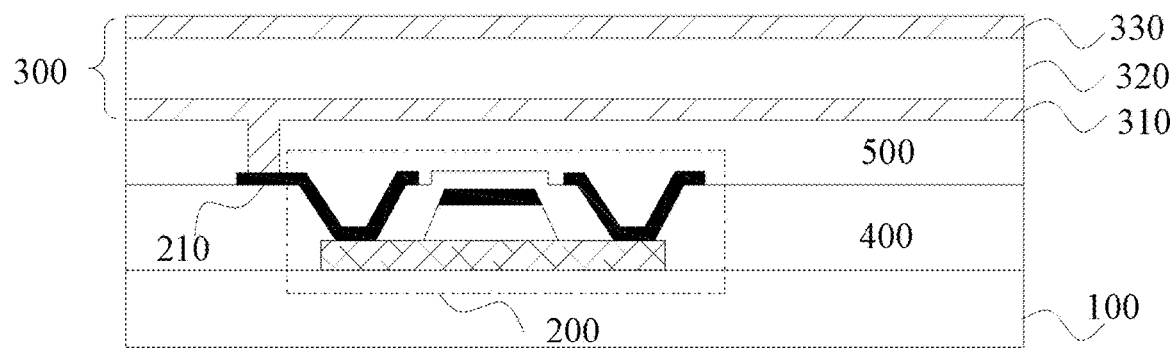
FIG. 1 shows a schematic cross-sectional structural view of a display cover plate according to some embodiments of the present disclosure.

The embodiments of the present disclosure are described in detail below, and examples of the embodiments are shown in the drawings, wherein the same or similar reference numerals indicate the same or similar elements or elements having the same or similar functions throughout. The embodiments described below with reference to the drawings are exemplary, and are only used to explain the present disclosure, and cannot be construed as limiting the present disclosure.

Some embodiments of the present disclosure provide a display cover plate. The display cover plate includes a substrate and an electrochromic unit disposed on the substrate. The electrochromic unit includes a first electrode, an electrochromic layer, and a second electrode that are sequentially disposed away from the substrate. Specifically, the first electrode is disposed on the substrate; the electrochromic layer is disposed on a side of the first electrode away from the substrate; and the second electrode is disposed on a side of the electrochromic layer away from the substrate. The first electrode and the second electrode are configured to generate an electric field, and the electrochromic layer allows light of different colors to pass through based on a change of the electric field. The display cover plate includes a plurality of electrochromic units arranged in an array on the substrate, and each electrochromic unit can be independently controlled to allow light having specific color to pass through. Each electrochromic unit may correspond to a pixel unit of the display substrate to form a display unit. The display unit may display different colors through characteristics of the electrochromic unit, the characteristics being to allow light of different colors to pass through based on the change of the electric field. The display unit corresponds to a sub-pixel of a conventional OLED display device or LCD device. In a conventional OLED display device or LCD device, three or more sub-pixels constitute a full-color display unit, by contrast, in a display device using the above display cover plate, only a single sub-pixel may constitute a full-color display unit. As a result, the PPI of the display device using the display cover plate is improved, that is, the resolution of the display device using the display cover plate is improved.

FIG. 1 is a schematic cross-sectional structural view of a display cover plate according to some embodiments of the present disclosure. FIG. 1 shows only one electrochromic unit. Some embodiments of the present disclosure provide a display cover plate. Referring to FIG. 1, the display cover plate includes a substrate 100 and a thin film transistor 200 on the substrate 100. The thin film transistor 200 includes a gate electrode, a source electrode, and a drain electrode 210. An electrochromic unit 300 is located on a side of the thin film transistor 200 away from the substrate 100. The electrochromic unit 300 includes an electrochromic layer 320. The electrochromic layer 320 may have different colors as the electric field conditions applied on the electrochromic layer 320 change, that is, the electrochromic layer 320 may have a variety of electrochromic colors. The electrochromic layer 320 is transparent, which means that the electrochromic layer 320 can allow light of different colors to pass through as the electric field applied to the electrochromic layer 320 changes. The change in the electric field conditions described here include changes in the duration of the electric field, changes in the intensity of the electric field and the like. The electrochromic unit 300 further includes a first electrode 310 and a second electrode 330. The first electrode 310 is disposed on the side of the thin film transistor 200 away from the substrate 100 and is electrically connected to the drain electrode 210 of the thin film transistor 200. The electrochromic layer 320 is located on a side of the first electrode 310 away from the substrate 100, and the second electrode 330 is disposed on a side of the electrochromic layer 320 away from the first electrode 310. Thus, the first electrode 310 and the second electrode 330 may form an electric field for controlling the electrochromic layer 320. Specifically, the first electrode 310 is connected to a first voltage signal, and the second electrode 330 is connected to a second voltage signal. There is a voltage difference between the first electrode 310 and the second electrode 330 to form the electric field. In some embodiments, the second voltage signal connected to the second electrode 330 is constant, and the first voltage signal 310 connected to the first electrode 310 is variable, so that the voltage difference between the first electrode 310 and the second electrode 330 is variable, thereby forming a variable electric field. By controlling the magnitude of the first voltage signal 310, the electric field intensity of the variable electric field can be controlled. The thin film transistor 200 is configured to control the first electrode 310 to receive the first voltage signal, that is, the thin film transistor 200 controls connection and/or disconnection between the first electrode 310 and the first voltage signal.

The source electrode and drain electrode of the thin film transistor used here may be symmetrical in structure, so the source electrode and drain electrode may be indistinguishable in structure. According to the characteristics of thin film transistors, transistors can be divided into N-type and P-type thin-film transistors. When the thin-film transistor is a P-type thin-film transistor, the turn-on voltage is a low-level voltage (for example, 0V, −5V, −10V or other suitable voltage), and the turn-off voltage is a high-level voltage (for example, 5V, 10V or other suitable Voltage); when the thin-film transistor is an N-type thin-film transistor, the turn-on voltage is a high-level voltage (for example, 5V, 10V or other suitable voltage), and the turn-off voltage is a low-level voltage (for example, 0V, −5V, −10V or other suitable voltage). It should be noted that, in the description herein, the thin film transistor is a P-type transistor as an example for description, but it is not intended to limit the present disclosure.

Figure 2:
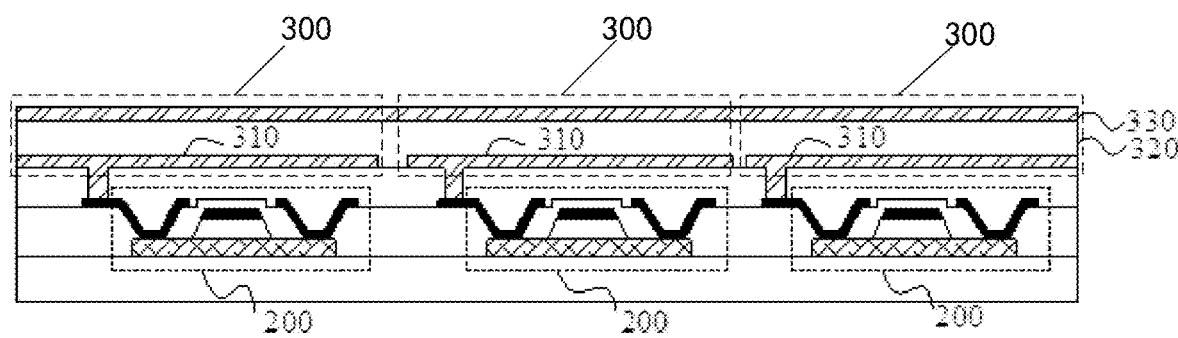
FIG. 2 shows a schematic cross-sectional structural view of a display cover plate according to some embodiments of the present disclosure.

FIG. 2 is a schematic cross-sectional structural view of a display cover plate according to some embodiments of the present disclosure. FIG. 2 shows a plurality of electrochromic units. FIG. 2 only schematically shows three electrochromic units 300, and those skilled in the art may understand that there may be more electrochromic units 300. In some embodiments, as shown in FIG. 2, the display cover plate includes a plurality of electrochromic units 300 disposed on the substrate 100, and the plurality of electrochromic units 300 are arranged in an array on the substrate 100. The display cover plate further includes a plurality of thin film transistors 200, and the plurality of thin film transistors 200 correspond to the plurality of electrochromic cells 300 in one-to-one correspondence. The plurality of first electrodes 310 of the plurality of electrochromic units 300 are independent of each other, and are controlled individually by the plurality of thin film transistors 200, respectively.

In some embodiments, the plurality of second electrodes 330 of the plurality of electrochromic units 300 may be a continuous integrated structure connected with a constant second voltage signal. The plurality of electrochromic layers 320 of the plurality of electrochromic units 300 may be a continuous integrated structure. This facilitates the manufacture of the display cover plate.

The thin film transistor 200 corresponding to the first electrode 310 of each electrochromic unit 300 is individually controlled. That is to say, each first electrode 310 and the corresponding second electrode 330 can form a controllable electric field, thereby controlling the electrochromic layer 320 within the range of the electric field to change color. Therefore, the color presented by the electrochromic layer 320 of each electrochromic unit 300 in the display cover plate can be individually adjusted by the electric field. The display cover plate may form a color display device with a display substrate having pixel units arranged in an array. Each electrochromic unit can correspond to a pixel unit of the display substrate to form a display unit. The display unit may display different colors by the characteristics of the electrochromic unit, the characteristics of the electrochromic unit being to allow light of different colors to pass through based on the change of the electric field. The display unit corresponds to a sub-pixel of a conventional OLED display device or LCD device. In a conventional OLED display device or LCD device, three or more sub-pixels constitute a full-color display unit, by contrast, in a display device using the above display cover, only a single sub-pixel may constitute a full-color display unit. As a result, the PPI of the display device using the display cover plate is improved, that is, the resolution of the display device using the display cover plate is improved.

In order to facilitate understanding, the following first briefly explains the principle that the display cover plate can achieve the above beneficial effects:

According to some embodiments of the present disclosure, the electrochromic layer 320 has a component with electrochromic function, which can exhibit different colors under different electric field conditions, thereby allowing light of different colors to pass through, and the color change can be reversibly changed with the change of the electric field conditions. Specifically, for example, the component can undergo reversible oxidation/reduction reactions under electric field conditions, and the color of the component in the oxidized state is different from the color of the component in the reduced state. The component can maintain a specific state without applying an electric field, and the color remains unchanged. When the electric field conditions change, the color of the component also changes. The electric field conditions are, for example, the duration of the applied voltage, the electric field intensity, and the like. Also, this component has multiple electrochromic colors. Thus, the color of the electrochromic layer 320 of the electrochromic unit 300 can be controlled by adjusting the electric field conditions between the first electrode and the second electrode. Therefore, the electrochromic layer may be similar to the color filter in the color film cover plate of the LCD device, or the color filter in the cover plate of the OLED display device. The difference is that in the above-mentioned LCD device or OLED display device, the color of each color filter cannot be changed, so it is only possible to form a pixel unit by combining multiple sub-pixels corresponding to different color filters to realize full color display. In the display cover plate according to the embodiments of the present disclosure, the electrochromic layer can exhibit multiple colors, so that one sub-pixel can be used to realize color display by adjusting the color change of the electrochromic layer. Therefore, the PPI of the display device can be greatly improved without reducing the size of a single sub-pixel.

According to some embodiments of the present disclosure, the electrochromic layer includes at least one of an inorganic substance that can undergo oxidation/reduction reactions under the action of an electric field, and an organic substance that can undergo ion implantation/extraction under the action of an electric field. The electrochromism is achieved through the conversion of the oxidized/reduced states of the inorganic substance, or through ion implantation/extraction of molecular chains of the organic substance. According to some embodiments of the present disclosure, the electrochromic layer may contain at least one of transition metal oxides, organic polymers, metal-supramolecular polymers, and metal ions. Thereby, controllable color development, color change, and color fading can be performed under the control of the electric field between the first electrode and the second electrode.

According to some embodiments of the present disclosure, the specific number of electrochromic colors that the electrochromic layer may have is not particularly limited, and for example, there may be more than three electrochromic colors. The aforementioned components with electrochromic function are also not particularly limited, and those skilled in the art can select appropriate materials to form the electrochromic layer. The aforementioned electric field conditions can be obtained from the voltage or the duration of the applied voltage.

Figure 3:
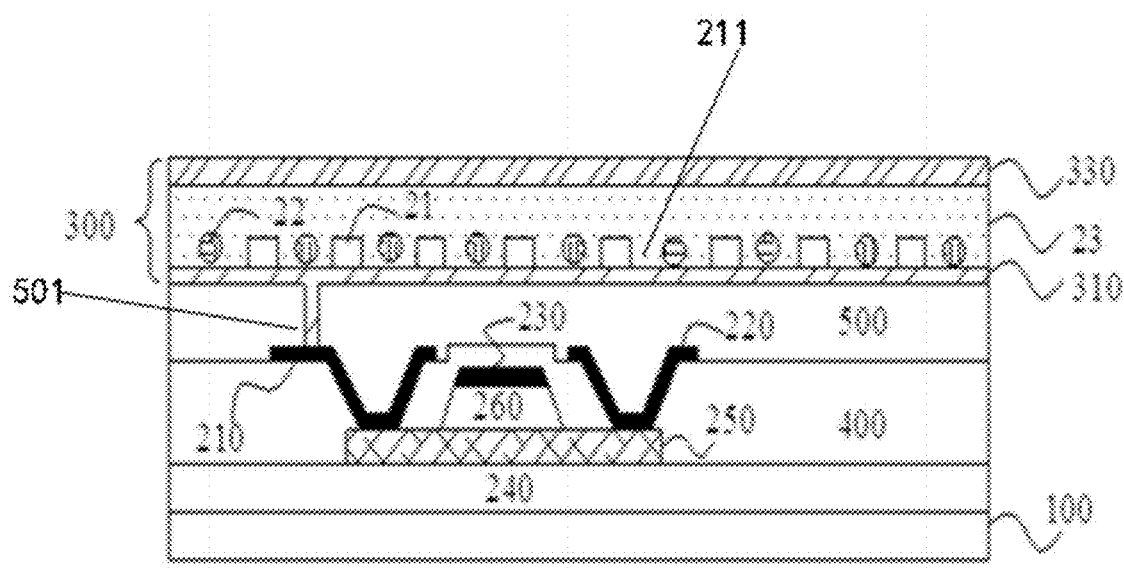
FIG. 3 shows a schematic cross-sectional structural view of a display cover plate according to some embodiments of the present disclosure.

FIG. 3 shows a schematic cross-sectional structural view of a display cover plate according to some embodiments of the present disclosure. FIG. 3 shows only one electrochromic unit. According to some specific embodiments of the present disclosure, referring to FIG. 3, the electrochromic layer 320 may include metal nanoparticles 22 having localized surface plasmon resonance characteristics, and a colored layer 23 containing a color-changing metal. The two together realize the above electrochromic process. Specifically, the localized surface plasmon resonance characteristics of precious metal nanoparticles including but not limited to gold (Au), silver (Ag), etc. can be utilized, and the oxidation and reduction processes of the color-changing metal can be controlled by an electric field, for example, the process and amount of oxidation (fading)/reduction (coloring) of the color-changing metal are specifically controlled, so that the electrochromic layer allows the transmitted light to move from near infrared to visible light within a few seconds. As a result, the rapid color change of the electrochromic layer can be achieved, thereby improving the display effect. For example, specifically, the metal nanoparticles 22 may include gold nanoparticles, and the material of the colored layer 23 may include silver ion gel. The conversion between fading and coloring is achieved through the oxidation/reduction of silver particles, and the amount and aggregation of silver particles that undergo oxidation and reduction are controlled by controlling the duration of applying an electric field, thereby realizing a variety of electrochromic colors. The oxidation of silver particles means that silver atoms lose electrons and are oxidized to silver ions, and the reduction of silver particles means that silver ions get electrons and are reduced to silver atoms. Specifically, when the first voltage signal received by the first electrode 310 is lower than the second voltage signal received by the second electrode 330, the silver particles perform a reduction process; and when the first voltage signal received by the first electrode 310 is higher than the second voltage signal received by the second electrode 330, the silver particles perform an oxidation process. According to some embodiments of the present disclosure, the particle size of the gold nanoparticles is in a range of 0.5 to 5 nm, and the content of silver ions in the silver ion gel is in a range of 0.5 to 50 mg/ml. Thereby, the display effect of the display device using the cover plate can be further improved. Specifically, when a certain value of voltage is applied to the electrochromic layer, the electrochromic layer can realize a red-yellow-green-blue color change within five seconds. As a result, the color of the colored layer can be changed quickly to achieve color display.

Figure 4:
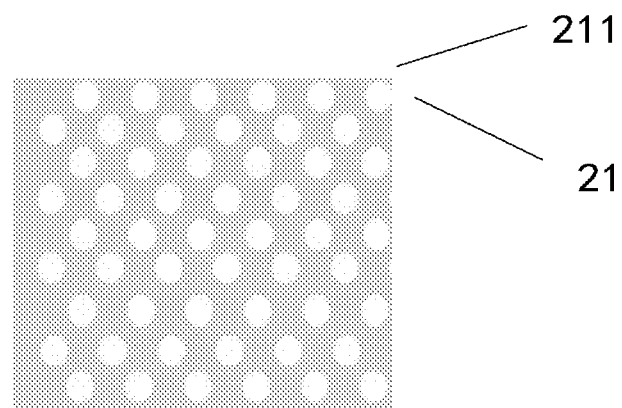
FIG. 4 shows a schematic top view of an insulating isolation layer according to some embodiments of the present disclosure.

According to some embodiments of the present disclosure, in order to further improve the electrochromic performance of the electrochromic layer, as shown in FIG. 3, the electrochromic layer 320 may further include an insulating isolation layer 21. FIG. 4 shows a schematic top view of an insulating isolation layer according to some embodiments of the present disclosure. Referring to FIGS. 3 and 4, the insulating isolation layer 21 has a plurality of through holes 211 for accommodating the metal nanoparticles 22. The insulating isolation layer 21 is located on the side of the first electrode 310 away from the substrate 100. In this way, the metal nanoparticles 22 with localized surface plasmon resonance characteristics can be filled in the through holes 211 of the insulating isolation layer 21 to prevent excessive metal nanoparticles 22 from aggregating and affecting localized surface plasmon resonance characteristics. Although only one metal nanoparticle 22 is shown in each through hole 211 in FIG. 4, those skilled in the art may note that the number of metal nanoparticles 22 contained in each through hole 211 may be one or more. The colored layer 23 containing silver ion gel may be filled into the through hole 211 to be in contact with the metal nanoparticles 22. Moreover, in order to form a relatively flat surface for the second electrode 330, the thickness of the colored layer 23 may be greater than the thickness of the insulating isolation layer 21, that is, the colored layer 23 is disposed on a side of the insulating isolation layer 21 away from the substrate 100 and filled in the through holes of the insulating isolation layer 21. The diameter of the through hole 211 in the insulating isolation layer 21 is not particularly limited, for example, it may be in a range of 10 to 100 nm, specifically 20 nm, 30 nm, 40 nm, 50 nm, 60 nm, 80 nm, 90 nm, etc. For example, specifically, the diameter of the through hole 211 of the insulating isolation layer 21 may be in a range of 40 to 60 nm. Thereby, the display effect of the display device using the cover plate can be further improved. It should be particularly noted here that the shape of the cross-section of the through hole in the insulating isolation layer 21 is not particularly limited. FIG. 4 only shows the case of a circle, and the cross-section of the through hole may also be square, hexagonal or other shapes, and those skilled in the art may choose according to the actual situation. More specifically, the cross-sectional shapes of the plurality of through holes in the insulating isolation layer 21 may be uniformly the same shape, and the cross-sections of the multiple through holes may also be different shapes, that is, one insulating isolation layer 21 may have multiple through holes with different cross-sectional shapes.

According to some embodiments of the present disclosure, in order to increase the transmittance of the display cover plate, the first electrode 310 and the second electrode 330 may be formed of a transparent conductive material. For example, the first electrode may be formed of a conductive metal oxide including but not limited to ITO, and the second electrode may be formed of ITO, or a transparent conductive film such as Ag or Mg.

According to some embodiments of the present disclosure, the substrate 100 has a plurality of electrochromic units 300, and each electrochromic unit may correspond to a sub-pixel in a display substrate (such as an LCD array substrate or an OLED backplane). In the following, the sub-pixel is also called a pixel unit. The plurality of first electrodes 310 of the plurality of electrochromic units 300 are spaced apart and insulated from each other. The plurality of second electrodes 330 of the plurality of electrochromic units 300 constitute a continuous integral structure, such as a plane electrode. An orthographic projection of the plane electrode on the substrate 100 covers an orthographic projection of the plurality of electrochromic units 300 on the substrate 100. Thus, the color of the electrochromic layer of each electrochromic unit 300 can be easily and individually controlled. That is, the display cover plate has a plurality of thin film transistors 200, and the plurality of thin film transistors 200 correspond to the plurality of electrochromic units 300 in one-to-one correspondence. The thin film transistor 200 controls the first electrode 310 connected thereto, so that the first electrode 310 functions like a pixel electrode in a liquid crystal display panel and receives a first voltage signal, and the second electrode can be applied with a second voltage signal, for example, a fixed common voltage, and functions like a common electrode. It should be particularly noted here that an output electrode of the thin film transistor is connected to the first electrode, and may be one of the source electrode and the drain electrode. Those skilled in the art can understand that the source electrode and the drain electrode of the thin film transistor are determined according to the nature of the carriers (P-type or N-type) in the active layer, one of the source electrode and the drain electrode is an input terminal, and the other is an output terminal. In the following, the first electrode 310 is connected to the drain electrode as an example for description, and it cannot be understood as a limitation to the present disclosure.

According to some embodiments of the present disclosure, referring to FIG. 3, a planarization layer 500 are further provided between the thin film transistor 200 and the first electrode 310. The first electrode 310 is connected to the drain electrode of the thin film transistor 200 through a via hole 501 penetrating the planarization layer 500. Thus, the electrochromic unit can be formed on a relatively flat surface. The specific type of the thin film transistor 200 is not particularly limited as long as it can control the first electrode. For example, the thin film transistor 200 may have structures such as a gate electrode 230, a source electrode 220 and the like, and a buffer layer 240 may be provided between an active layer 250 and the substrate 100. In addition, the source electrode 220 and the drain electrode 210 may be provided in the same layer, and an interlayer insulating layer 400 may also be formed between the source-drain electrode layer where the source electrode and the drain electrode are located and the gate layer where the gate electrode 400 is located.

Figure 5:
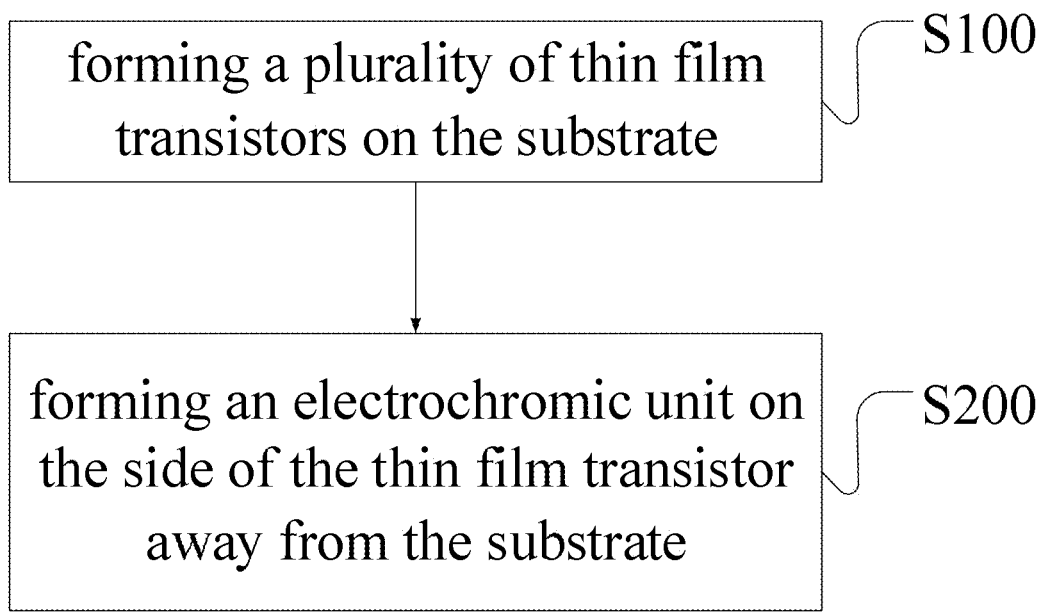
FIG. 5 shows a schematic flow chart of a method for manufacturing a display cover plate according to some embodiments of the present disclosure.

FIG. 5 is a schematic flowchart of a method for manufacturing a display cover plate according to some embodiments of the present disclosure. Some embodiments of the present disclosure provide a method of preparing the aforementioned display cover plate. Referring to FIG. 5, the method includes the following steps:

S100: forming a plurality of thin film transistors on the substrate;

According to some embodiments of the present disclosure, in this step, a plurality of thin film transistors may be formed on the substrate first. As mentioned above, the plurality of thin film transistors may correspond to a plurality of electrochromic units arranged in an array, that is, the thin film transistors may also be arranged in an array to control the first electrodes of the corresponding electrochromic units. Since the electrochromic units and sub-pixels on the display cover plate are in one-to-one correspondence, in order to reduce production costs, the above thin film transistors may be manufactured by using the processes, masks and other equipments for manufacturing the switching thin film transistors of the array substrate or the backplane. The specific structure of the thin film transistor is not particularly limited as long as it can function to control the voltage of the first electrode. For example, the thin film transistor may have an active layer, and a control terminal (gate electrode), an output terminal, and an input terminal. The control terminal can control the switching of the thin film transistor, thereby controlling whether the voltage is applied to the first electrode connected to the thin film transistor, and the output terminal (one of the source electrode and the drain electrode) is electrically connected to the first electrode to control specific voltage value applied to the first electrode. The formed thin film transistor may have a structure as shown in FIG. 3.

S200: forming an electrochromic unit on the side of the thin film transistor away from the substrate.

According to some embodiments of the present disclosure, an electrochromic unit is formed in this step. The electrochromic unit may have the structure described above and will not be repeated here. Specifically, in this step, the first electrode of the electrochromic unit is electrically connected to the source electrode or drain electrode of the thin film transistor. Thus, the display cover plate described above can be obtained easily.

According to some embodiments of the present disclosure, forming the electrochromic unit may specifically include the following steps:

First, a first electrode may be formed on the side of the thin film transistor away from the substrate. The first electrode may be formed by depositing an entire layer of ITO followed by patterning, and the first electrode is electrically connected to the source electrode or drain electrode of the thin film transistor through a via hole penetrating the planarization layer. Subsequently, an insulating isolation layer may be formed on the side of the first electrode away from the thin film transistor, and a through hole penetrating the insulating isolation layer may be formed in the insulating isolation layer. The structures of the insulating isolation layer and the through holes provided therein have been described in detail above, and will not be repeated here. In some embodiments, the through hole in the insulating isolation layer may be formed by nanoimprinting. Next, metal nanoparticles are formed in the through holes, specifically, gold nanoparticles can be formed in the through holes of the insulating isolation layer by evaporation or the like. And then a colored layer having a silver ion gel is formed on the side the insulating isolation layer away from the first electrode, and the colored layer is also filled into the through holes. Finally, a second electrode is formed on the side of the colored layer away from the first electrode. Thus, the electrochromic unit can be easily formed. The formed electrochromic unit 300 may have a structure as shown in FIG. 3.

Figure 6:
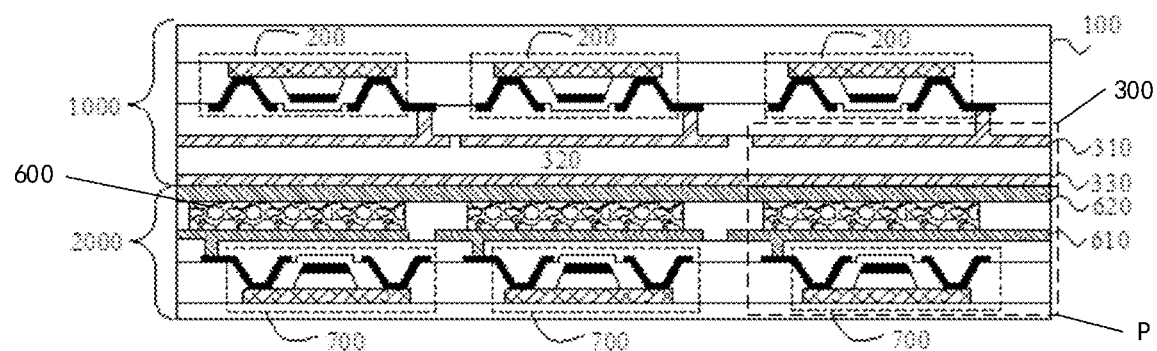
FIG. 6 shows a schematic cross-sectional structural view of a display device according to some embodiments of the present disclosure.

FIG. 6 shows a schematic cross-sectional structural view of a display device according to some embodiments of the present disclosure. Some embodiments of the present disclosure provide a display device. Referring to FIG. 6, according to some embodiments of the present disclosure, the display device includes the display cover plate 1000 described above. Thus, the display device may have all the features and advantages of the display cover plate described above, and in general, the display device can have a higher PPI.

The specific type of the display device is not particularly limited, and it may be an LCD device or an OLED display device. For example, it may be a flexible OLED display device. For example, specifically, the display device can be used for special displays such as medical treatment, exhibition or the like. Taking the display device as an OLED display device as an example, the display device may include a display backplane 2000 having a plurality of organic light emitting devices. The packaging structure seals the organic light emitting devices on the display backplane 2000.

According to some embodiments of the present disclosure, the substrate 100 of the display cover plate 1000 faces away from the display backplane 2000. Thus, the lifetime and display effect of the display device can be further improved. According to some embodiments of the present disclosure, the display backplane 2000 may have a plurality of pixel units P arranged in an array, each pixel unit P has a driving thin film transistor 700 and an organic light emitting diode, and each driving thin film transistor is electrically connected to an anode 610 of a corresponding organic light emitting diode to control a light emitting layer 600 of the organic light emitting diode to emit light. The multiple organic light emitting diodes of the multiple pixel units P may also have a common cathode 620. The multiple organic light emitting diodes may all be white OLEDs. The plurality of pixel units P correspond to the plurality of electrochromic units 300 in one-to-one correspondence. An orthographic projection of the pixel unit P on the substrate 100 at least partially overlaps an orthographic projection of the corresponding electrochromic unit 300 on the substrate 100.

As described above, since the electrochromic layer of each electrochromic unit 300 in the display cover plate 1000 according to the embodiments of the present disclosure can be independently controlled, and the electrochromic layer of one electrochromic unit 300 can realize multiple different colors, a single pixel unit (sub-pixel) can realize color display, that is, each pixel unit P may contain only one light-emitting layer 600. For example, three pixel units P are shown in FIG. 6. Compared with the display device in the relative art that requires three or more pixels to form a pixel unit, the display device according to the embodiments of the present disclosure can obviously have a higher PPI, for example, the PPI can be increased by 3-4 times.

In the description of the present disclosure, the orientations or positional relationships indicated by the terms "upper", "lower", etc. is based on the orientations or positional relationships shown in the drawings, which is only for the convenience of describing the present disclosure and does not require that the present disclosure must be constructed and operated in a specific orientation, thus, it cannot be construed as a limitation of the present disclosure.

In the description of this specification, the description referring to the terms "one embodiment", "another embodiment", etc. means that the specific features, structures, materials, or characteristics described in conjunction with the embodiment are included in at least one embodiment of the present disclosure. In this specification, the schematic representation of the above terms does not necessarily refer to the same embodiment or example. Moreover, the specific features, structures, materials, or characteristics described may be combined in any suitable manner in any one or more embodiments or examples. In addition, without contradicting each other, those skilled in the art may combine different embodiments or examples and features of different embodiments or examples described in this specification. In addition, it should be noted that in this specification, the terms "first" and "second" are for descriptive purposes only and cannot be understood as indicating or implying relative importance or implicitly indicating the number of technical features indicated.

Although the embodiments of the present disclosure have been shown and described above, it should be understood that the above-mentioned embodiments are exemplary and cannot be construed as limitations to the present disclosure. Those skilled in the art may make changes, modifications, substitutions, and variations to the above-described embodiments within the scope of the present disclosure.

What is claimed is:

1. An organic light emitting display device, comprising:
    a display cover plate, comprising:
        a substrate; and
        an electrochromic unit on the substrate, the electrochromic unit comprising:
        a first electrode on the substrate;
        an electrochromic layer on a side of the first electrode away from the substrate; and
        a second electrode on a side of the electrochromic layer away from the substrate,
        wherein the first electrode and the second electrode are configured to generate an electric field, and the electrochromic layer allows light of different colors to pass through based on a change of the electric field;
        wherein the electrochromic layer comprises:
            metal nanoparticles with localized surface plasmon resonance characteristics;
            a colored layer containing a color-changing metal that may undergo oxidation and/or reduction reactions under the action of the electric field; and
            an insulating isolation layer on the side of the first electrode away from the substrate, the insulating isolation layer being provided with a through hole penetrating the insulating isolation layer,
            wherein the metal nanoparticles are accommodated in the through hole, and the colored layer is located on a side of the insulating isolation layer away from the first electrode, and is filled into the through hole,
            wherein the metal nanoparticles comprise gold nanoparticles, and a material of the colored layer comprises silver ion gel,
            wherein a particle size of the gold nanoparticles is in a range of 0.5 to 5 nm, and a content of silver ions in the silver ion gel is in a range of 0.5 to 50 mg/ml, and
            wherein a thickness of the colored layer is greater than a thickness of the insulating isolation layer;
    a display backplane having a plurality of organic light emitting devices, wherein the substrate of the display cover plate faces away from the display backplane, and
    a packaging structure configured to seal the organic light emitting devices on the display backplane,
    wherein the display backplane comprises a pixel unit, and an orthographic projection of the pixel unit on the substrate of the display cover plate at least partially overlaps an orthographic projection of the electrochromic unit on the substrate of the display cover plate.

2. The organic light emitting display device of claim 1, wherein the change of the electric field comprises a change in a duration of the electric field and a change in an intensity of the electric field.

3. The organic light emitting display device of claim 1, wherein both the first electrode and the second electrode are formed of a transparent conductive material.

4. The organic light emitting display device of claim 1, wherein a diameter of the through hole in the insulating isolation layer is in a range of 10 to 100 nm.

5. The organic light emitting display device of claim 4, wherein the diameter of the through hole in the insulating isolation layer is in a range of 40 to 60 nm.

6. The organic light emitting display device of claim 1, further comprising:
    a thin film transistor between the substrate and the electrochromic unit, the thin film transistor comprising a source electrode and a drain electrode,
    wherein the first electrode is electrically connected to the source electrode or the drain electrode of the thin film transistor,
    the thin film transistor is configured to control the first electrode to receive a first voltage signal.

7. The organic light emitting display device of claim 6, further comprising:
    a planarization layer between the thin film transistor and the first electrode,
    wherein the first electrode is electrically connected to the source electrode or the drain electrode of the thin film transistor through a via hole penetrating the planarization layer.

8. The organic light emitting display device of claim 1, wherein the display cover plate comprises a plurality of electrochromic units arranged in an array, and the plurality of second electrodes of the plurality of electrochromic units constitute a continuous integral structure.

9. The organic light emitting display device of claim 8, wherein the plurality of electrochromic layers of the plurality of electrochromic units constitute a continuous integral structure.

10. A method for manufacturing the display cover plate of claim 1, comprising:
    forming a first electrode on a substrate;
    forming an electrochromic layer on a side of the first electrode away from the substrate; and
    forming a second electrode on a side of the electrochromic layer, wherein, the first electrode and the second electrode are configured to generate an electric field, and the electrochromic layer allows light of different colors to pass through based on a change of the electric field, wherein forming the electrochromic layer on the side of the first electrode away from the substrate comprises:
 forming an insulating isolation layer on the side of the first electrode away from the substrate;
 forming a through hole penetrating the insulating isolation layer in the insulating isolation layer;
 forming metal nanoparticles in the through hole; and
 forming a colored layer on a side of the insulating isolation layer away from the substrate and in the through hole,
 wherein the metal nanoparticles comprise gold nanoparticles, and a material of the colored layer comprises silver ion gel,
 wherein a particle size of the gold nanoparticles is in a range of 0.5 to 5 nm, and a content of silver ions in the silver ion gel is in a range of 0.5 to 50 mg/ml, and
 wherein a thickness of the colored layer is greater than a thickness of the insulating isolation layer.

11. The method of claim 10, before forming the first electrode on the substrate, the method further comprises:
 forming a thin film transistor on the substrate,
 wherein the thin film transistor is located between the substrate and the first electrode.

12. The organic light emitting display device of claim 1, wherein the display cover plate comprises a plurality of electrochromic units arranged in an array, the display backplane comprises a plurality of pixel units arranged in an array, and the plurality of electrochromic units correspond to the plurality of pixel units in one-to-one correspondence.

* * * * *